United States Patent [19]

Kampmann

[11] 4,220,817
[45] Sep. 2, 1980

[54] AUDIO PLAYBACK SYSTEMS
[75] Inventor: Frank S. Kampmann, Arlington, Mass.
[73] Assignee: Apt Corporation, Cambridge, Mass.
[21] Appl. No.: 942,494
[22] Filed: Sep. 15, 1978
[51] Int. Cl.² ............................................. H03G 5/16
[52] U.S. Cl. ................................. 179/1 D; 330/109; 330/294; 333/28 T
[58] Field of Search .......... 179/1 D, 100.1 TC, 1 VL; 333/28 T; 330/107, 109, 294

[56] References Cited

U.S. PATENT DOCUMENTS

| | | | |
|---|---|---|---|
| 3,130,374 | 4/1964 | Beres et al. | 333/28 T |
| 3,449,681 | 6/1969 | Hafler | 330/109 |
| 3,460,071 | 8/1969 | Schott | 333/28 T |
| 4,151,477 | 4/1979 | Yokoyama | 330/107 |

OTHER PUBLICATIONS

Iwao Iwamoto, "MFR Component Amplifier SA-30", Toshiba Review, Jan.-Feb. 1970, pp. 55-58.
D. Bohn, Audio Handbook, Published by National Semiconductor Corporation, 1976, pp. 2-45.
P. Baxandall, "Negative Feedback Tone Control", Wireless World, Oct. 1952, pp. 402-405.

*Primary Examiner*—Bernard Konick
*Assistant Examiner*—Randall P. Myers
*Attorney, Agent, or Firm*—Robert F. O'Connell

[57] ABSTRACT

Improved circuitry for providing bass control in audio playback systems using feedback circuits wherein undesirable deviations in frequency response above the bass region exhibited by previously available Baxandall feedback circuits are substantially eliminated by utilizing, in a preferred embodiment, a voltage follower amplifier, such as an emitter-follower transistor circuit in association with a single capacitance in the bass control circuit, which eliminates the undesirable frequency response deviations at the mid-frequency and higher frequency ranges so that frequency response curves at all settings of the bass control substantially coincide above the bass region.

9 Claims, 8 Drawing Figures

AUDIO PLAYBACK SYSTEMS

This invention relates generally to circuitry for use in audio playback systems and, more particularly, to circuitry capable of providing bass control, or loudness compensation control for improving the playback qualities of audio sound.

With the increased popularity of high fidelity sound reproduction systems more attention has been paid in recent years to the development of controls for the sound level in the bass region of the audio spectrum, as well as over the complete audio frequency range. One such control circuit as described in the literature, was devised in 1952 by P. J. Baxandall, e.g., "Negative Feedback Tone Control", P. J. Baxandall, Wireless World, October 1952, page 402. A more recent description is contained in the publication "Audio Handbook" published by and available from National Semiconductor Corporation of Santa Clara, California, 1976, (pages 2-45). Such control circuit appears to have been the most common active control circuit utilized in sound reproduction systems in recent years. By such circuitry the Baxandall circuit provides a nominally fixed gain in the audio midrange, and variable gains in the bass and treble ranges, controlled by variable potentiometers, called bass and treble controls. The Baxandall circuit is widely used because it provides for both a subjectively pleasing boost and attenuation versus frequency characteristic, and a smooth control action as a function of potentiometer rotation. Such circuitry, however, introduces noticeable and undesirable audio effects, or irregularities, the origins of which have not been heretofore indentified. Because the generation of such undesirable effects has not been known, there have been no effective circuits devised to eliminate them. It is desirable, however, to provide bass control circuitry which can produce the desired bass effect of the Baxandall circuitry, while at the same time avoiding undesirable audible effects which appear to occur at frequencies generally above the bass range of the audio spectrum.

BRIEF SUMMARY OF THE INVENTION

This invention is based on the recognition that the undesirable audio effects in the Baxandall type circuit are produced at frequencies generally at the upper portion of or just above the bass range (effectively within the mid-range of the audio spectrum). Thus, when the circuit operates to provide a desired boost, or a desired cut, in the bass range frequencies, a corresponding undesirable cut, or corresponding undesirable boost, respectively, arises in the signal amplitude at such mid-range frequencies. The circuit of the invention eliminates such mid-range amplitude problems while, at the same time, retaining the desired Baxandall bass control characteristics. Such operation is accomplished by a modification of the resistance-capacitance configuration in the bass control network of the Baxandall type circuit. Such modification retains the basic Baxandall operation while providing a substantially flat frequency response above the bass range.

DESCRIPTION OF THE INVENTION

The invention can be described in more detail with the help of the accompanying drawings wherein FIG. 1 shows a conventional tone control circuit of the Baxandall type used by the prior art;

Figure 1:
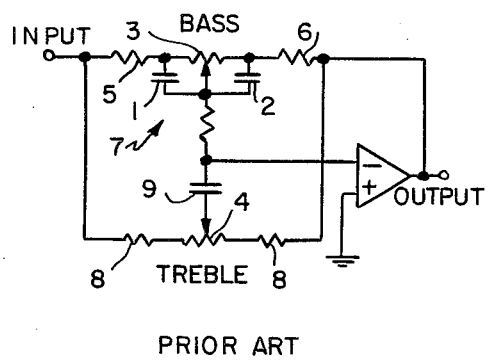
Figure 2:
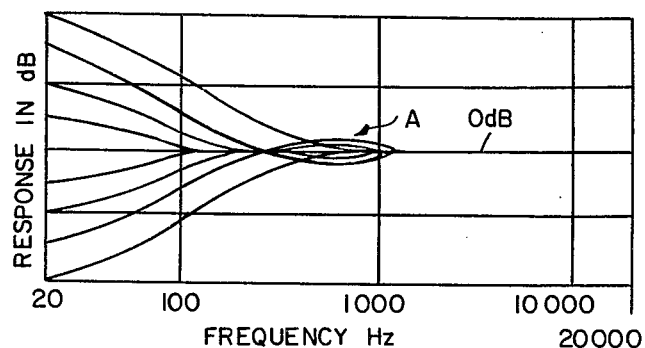
FIG. 2 shows typical response curves of the circuit of FIG. 1 as a function of frequency for various bass control settings.

FIG. 1 shows a relatively standard Baxandall circuit available at the present time, as discussed, for example, in the above-referred to Audio Handbook, which circuit provides bass and treble active tone controls. At very low frequencies the impedance of capacitor divider circuit 7 comprising the capacitors 1 and 2 is large enough that they may be considered open circuits and the gain is controlled by bass control means, i.e., the bass potentiometer 3. At very high fequencies the impedance of the capacitors is small enough that they may be considered short circuits and the gain is controlled by treble control means, i.e., the treble potentiometer 4 having stop resistors 8 connected at each end thereof. It has now been determined that such circuits, depending on the capacitor and resistor values utilized, will produce an undesired mid-range response when bass boost (or bass cut) is required. Such mid-range problem is depicted by the exemplary response curves of FIG. 2 in which interactions occur between the frequency response of the circuit at frequencies generally above the bass region and the frequency response of the circuit in the bass region due to the control of the bass response by the action of bass potentiometer 3. Such interactions which arise over a frequency range generally depicted at "A" take the form of noticeable amounts of mid-range cuts in frequency response when bass boost is called for, and vice versa. The total range of such undesired interaction can be reduced, at best, to about ±0.5 dB, for example, even in Baxandall designs which are optimized for minimum interaction. Such interaction operation produces a highly undesirable audible effect in sound reproduction systems. While the undesirable audible effect has been previously noted by those in the art, up to now the cause thereof, as shown in FIG. 2, has not been recognized.

Figure 3:
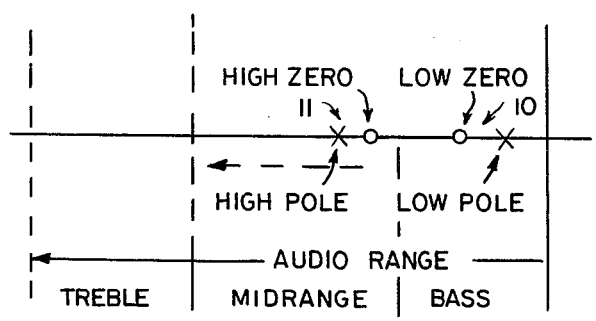
FIG. 3 shows a graph in the frequency domain showing a typical set of pole/zero combinations present in the circuit of FIG. 1.
Figure 3A:
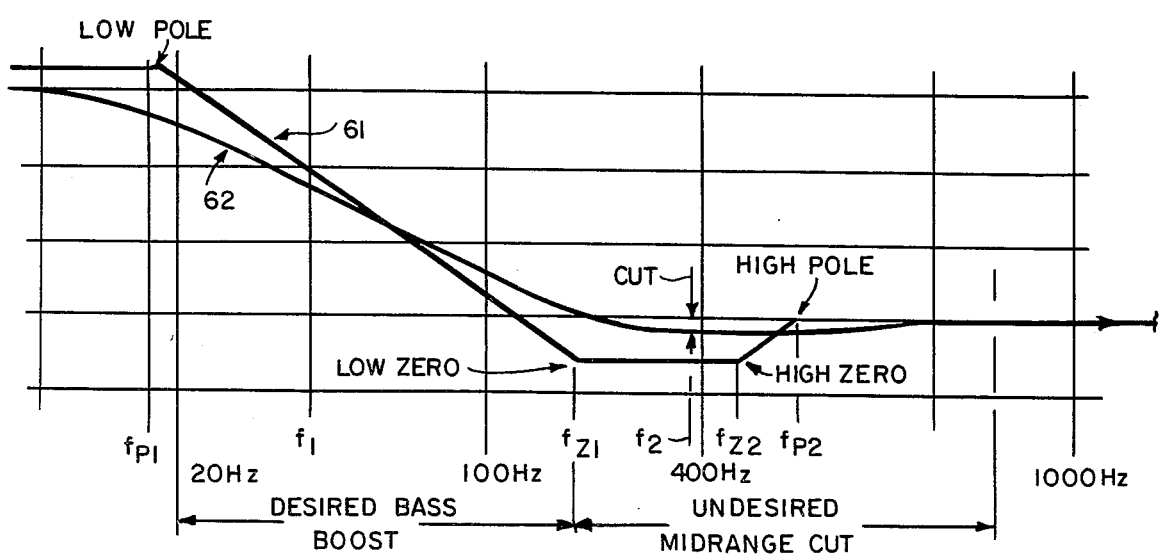
FIG. 3A shows an exemplary response curve for a particular bass control setting for the circuit of FIG. 1 to depict the relationship thereof to the poles and zeroes of FIG. 3.

An insight into the basic nature of the mid-range problem can be gained with the help of the graph of FIG. 3. The figure depicts a pole/zero graph in the frequency domain of the poles and zeros present in a basic Baxandall circuit of the type depicted in FIG. 1. The frequency response of the circuit in the bass region is controlled in accordance with a transfer function substantially defined by the pole frequency and the zero frequency in the bass region. As can be seen in FIG. 3A, the pole and zero frequencies of the bass region pole/zero combination 10 represent the effective breakpoints of the Bode asymptotic frequency response curves, exemplary response curves plotted as a function of frequency being shown in FIG. 3A. Such breakpoints can be defined as frequencies at which the rate of change (i.e., the slope) of the Bode asymptotic response curve changes, as identified in an exemplary curve 61. The actual response is shown by curve 62. For different settings of the bass potentiometer 3 in the basic Baxandall circuit of FIG. 1, for example, the locations of both the low and high frequency poles and zeroes vary accordingly.

If the setting of the bass potentiometer, i.e., the effective percentage of motion thereof (in this case the rotation thereof), is defined as "K", where K is capable of varying over a range $0 \leq K \leq 1$, it is found that the low frequency pole, for example, will move along the frequency axis in the frequency domain graph of FIG. 3 in accordance with the expression $1/K$, i.e., the pole frequency is determined by the relationship $f_{P1} = (f_1/2)(1/K)$, while the zero will move in accordance with $1/(1-K)$, i.e., the zero frequency is determined by the relationship $f_{Z1} = (f_1/2)(1/(1-K))$. In such relationships the frequency $f_1$ is predetermined by the values selected for the fixed and variable circuit elements 1, 2, 3, 5 and 6 in accordance with whatever application the circuit is to be used, as is known to the art. It has been found that the movement of the pole and zero frequencies of pole/zero combination 10 in such a manner provides an effective bass control operation for feedback type circuits.

The pole and zero locations will depend on which end of the potentiometer is defined as the "0" end. Thus, in the circuit as described, movement of the variable arm of potentiometer from left to right in FIG. 1 represents conventional clockwise rotation of the potentiometer (i.e., clockwise rotation provides increased bass while counterclockwise rotation provides decreased bass) and the center portion, where K=0.5, gives a substantially flat bass response. If the "0" end is the left end, the pole and zero frequencies are as shown in FIG. 3. If the right end is the "0" end, the pole and zero frequencies are interchanged.

Were pole/zero combination 10 the only one present in the basic Baxandall circuit, the bass control response would be an effective and pleasant one, even for the discriminating listener. However, it has been found that a second pole/zero combination 11 is also present within a frequency region of the audio range generally above the bass region, as shown in FIG. 3. It is the presence of such latter pole/zero combination which produces the undesirable mid-range problem discussed above and depicted in FIG. 2.

One approach to reducing the effect of the mid-range problem, while at the same time retaining the desirable response characteristics of the overall Baxandall circuit, is to reduce each of the balanced resistors 5 and 6 to as low a value as possible in the circuit of FIG. 1. The reduction thereof tends to cause the undesired pole/zero combination 11 to move in a direction toward the high end of the audio range as shown by the dashed line associated therewith. If it were possible to reduce such resistors to a sufficiently low level, it might be possible to move pole/zero combination 11 completely out of the audio range so that the response characteristic shown at region A of FIG. 2 is no longer within the audible range of the sound system being used. In such approach, however, it is found that reduction of the resistance values 5 and 6 cannot be achieved in a practical manner without giving rise to unreasonable power requirements for the system.

Furthermore, such an arrangement would defeat the primary purpose of these resistors, which is to limit the maximum amount of bass boost or cut available at the extremes of the control action, and would practically require the addition of two more resistors in series with each side of the bass control potentiometer 3 to limit the effective percentage of rotation K, thus limiting the maximum boost or cut available. It is more desirable to achieve a complete elimination of such pole/zero combination so as to eliminate the mid-range problem without increasing the power requirements undesirably.

Figure 4:
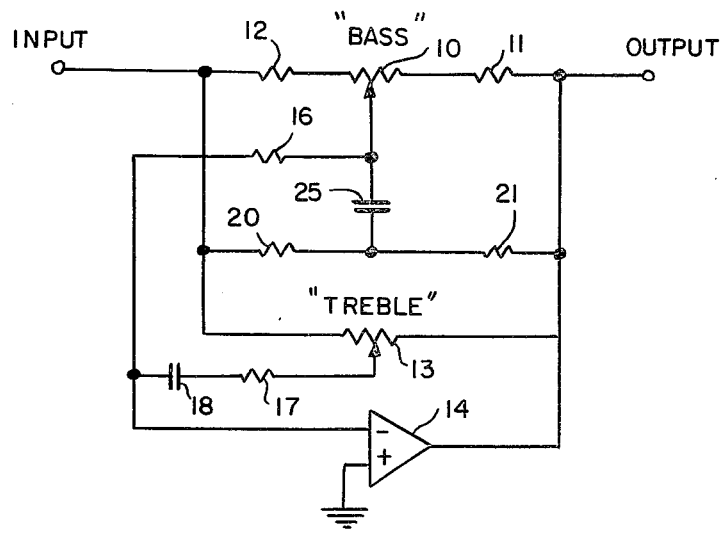
FIG. 4 shows a schematic diagram of one embodiment of the circuitry of the invention.

One technique for achieving such result in accordance with the invention is shown in FIG. 4 wherein the stop resistors 5 and 6 and the capacitor divider circuit 7 of FIG. 1 are replaced with a network which includes a resistance divider comprising resistors 20 and 21 between the input and output together with capacitor 25 connected from the mid-point of the resistors to the inverting input of audio output amplifier 14 via resistor 16. To achieve a somewhat different treble control characteristic from the standard Baxandall circuit, the stop resistors 8 and series capacitor 9 of the treble potentiometer circuit in FIG. 1 are replaced by the series network comprising resistor 17 and capacitor 18.

Figure 5:
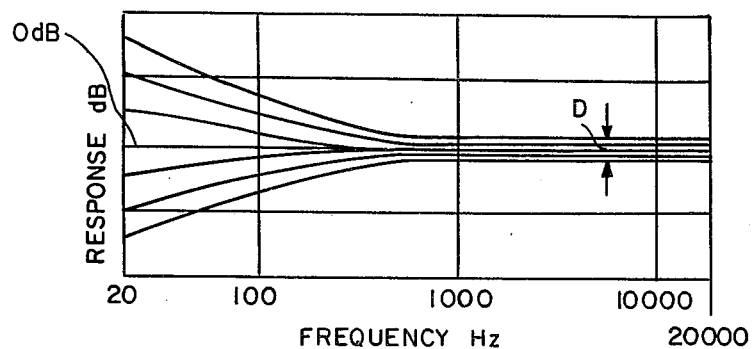
FIG. 5 shows a graph of exemplary response curves for the circuit of FIG. 4 for various bass control settings.

The circuit of FIG. 4 provides a family of response curves as exemplarily shown in FIG. 5. As can be seen therein the mid-range problem depicted in FIG. 2 is eliminated, i.e., a boost (or cut) in the bass region does not produce an undesirable interaction, i.e., a cut or boost, in the mid-range region. It is found, however, that in the operation of the circuit of FIG. 4 the response at the mid-range and higher frequency range, while substantially constant as a function of frequency, differs for different bass potentiometer settings. The overall amplitude range for such different levels in the upper frequency regions, shown as "D" in FIG. 5, may be chosen small (e.g., less than 0.1 dB) by appropriate selection of resistors 20 and 21 so that such operation may be perfectly acceptable in many applications.

Figure 6:
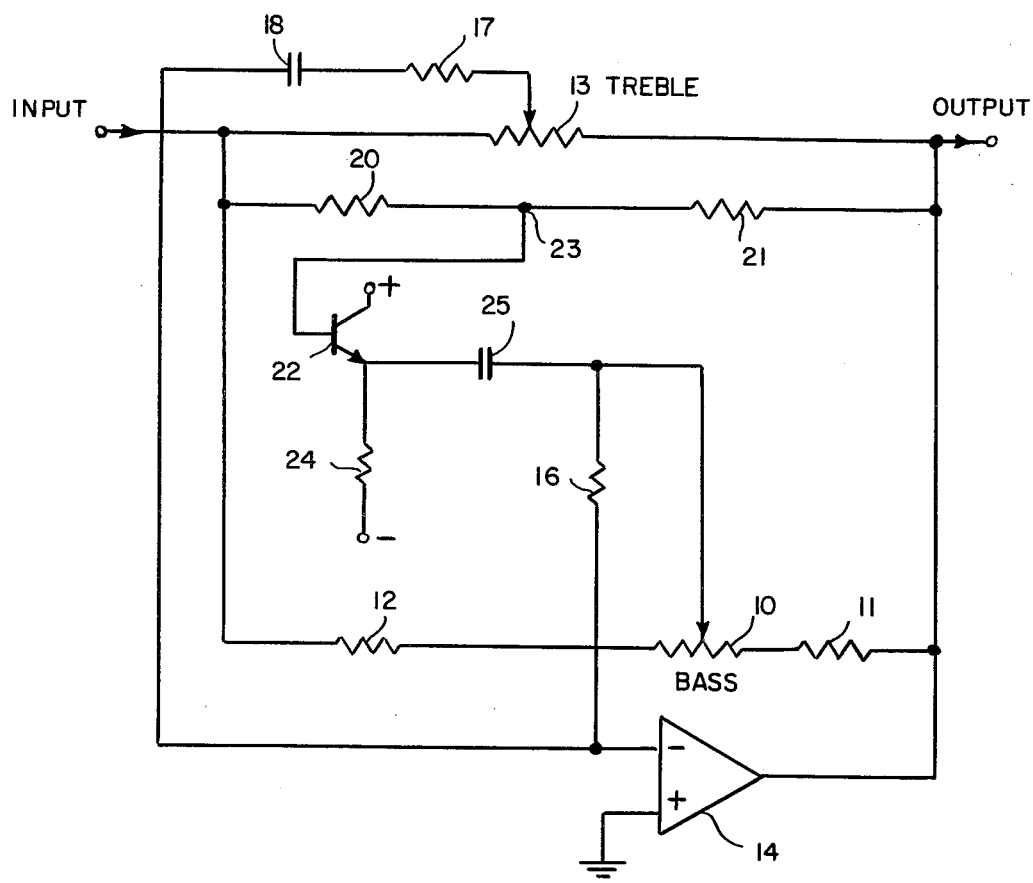
FIG. 6 shows an alternative embodiment of the circuit of the invention.

In other applications, however, it may be desirable to eliminate such level differences altogether so that the response curves at all settings of the bass control are the same in the mid and high frequency regions. Such a response can be achieved with the modification of the circuit of FIG. 4, as shown in FIG. 6. As can be seen therein the midpoint of resistors 20 and 21 is connected to the input of a voltage follower amplifier, shown here as the base of emitter-follower transistor 22, the emitter thereof being the output of the amplifier and connected to capacitor 25. The use of such voltage follower amplifier eliminates the level differences which occur at the mid and higher frequency regions and provides the response shown in FIG. 7 wherein the response curves all coincide at frequencies generally above the bass region. Accordingly, operation of the bass control potentiometer circuit does not produce any interaction with the foregoing response above the bass region.

Figure 7:
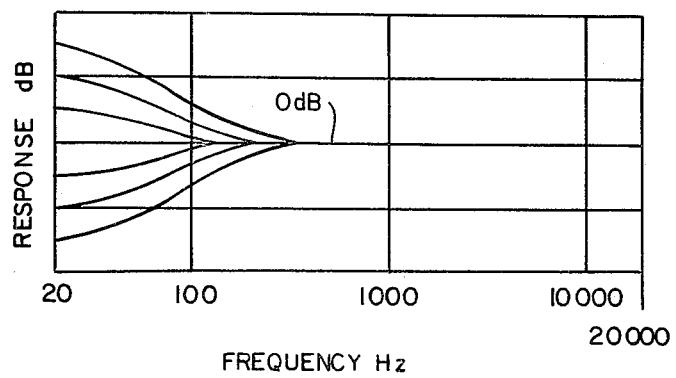
FIG. 7 shows exemplary response curves for the circuit of FIG. 6 for various bass control settings.

In both the circuits of FIG. 4 and FIG. 6, the desirable characteristics of the Baxandall circuit are retained (i.e., the low frequency breakpoint regions are generally determined by $1/K$ and $1/(1-K)$ where K is a function of the rotation of the bass control potentiometer to produce the bass control response required), but the undesired mid-range problem in the frequency region A of FIG. 2 has been completely eliminated, as a comparison of the curves of FIGS. 5 and 7 with the curves of FIG. 2 shows.

The above description discloses new and improved circuitry for providing bass control in audio playback systems which has advantages over those previously known. It should be appreciated that the modifications to the preferred embodiments described herein may occur to those in the art within the spirit and scope of the teachings herein. Accordingly, the invention is not to be limited to the specific embodiments described above, except as defined by the appended claims.

What is claimed is:

1. Circuitry for use over the audio frequency range and responsive to an audio input signal for producing an audio output signal, said circuitry comprising bass control circuitry responsive to said input signal including variable control means having variable impedance means, the variable impedance of which is represented by a parameter, K, capable of varying over a preselected range, for selectively controlling the frequency response of said circuit in the bass region of said audio frequency range substantially in accordance with a transfer function defined by a pole frequency and a zero frequency, the pole frequency being substantially determined by a first relationship such that it is directly proportional to f and inversely proportional to K, and the zero frequency being substantially determined by a second relationship such that it is directly proportional to f and inversely proportional to $(1-K)$, where f is a predetermined frequency; and means connected to such variable control means for preventing interactions between the frequency response of said circuitry at frequencies above said bass region and the frequency response of said circuitry in said bass region due to said selective controlling of the frequency response in said bass region.

2. Circuitry in accordance with claim 1 wherein said first relationship is $(f/2)(1/K)$ and said second relationship is $(f/2)(1/(1-K))$.

3. Circuitry in accordance with claims 1 or 2 wherein the preselected range of the parameter K is the range $0 \leq K \leq 1$.

4. Circuitry in accordance with claim 3 wherein said variable impedance means is a variable potentiometer and the parameter K represents an effective percentage of rotation of said variable potentiometer.

5. Circuitry in accordance with claim 4 and further including output amplifier means for providing said audio output signal and further wherein said preventing means includes network means comprising a pair of resistance means across said variable potentiometer means;

capacitance means connecting said resistance means to said variable potentiometer means; and resistance means connecting said variable potentiometer means to said output amplifier means.

6. Circuitry in accordance with claim 5 wherein said preventing means further includes voltage follower means connected between said resistance means of said network and said capacitance means thereof.

7. Circuitry in accordance with claim 6 wherein said voltage follower means comprises an emitter-follower transistor means.

8. Circuitry in accordance with claim 1 wherein said variable impedance means is a variable potentiometer and the parameter K represents an effective percentage of rotation of said variable potentiometer.

9. Circuitry in accordance with claim 1 and further including output amplifier means for providing said audio output signal and further wherein said preventing means includes network means comprising a pair of resistance means across said variable potentiometer means;

capacitance means connecting said resistance means to said variable potentiometer means; and resistance means connecting said variable potentiometer means to said output amplifier means.

* * * * *